United States Patent [19]

Sugai et al.

[11] Patent Number: 4,680,793
[45] Date of Patent: Jul. 14, 1987

[54] NOISE ELIMINATING CIRCUIT

[75] Inventors: Yoshiro Sugai; Hiroyuki Kimura, both of Saitama, Japan

[73] Assignee: Pioneer Electronic Corporation, Tokyo, Japan

[21] Appl. No.: 726,753

[22] Filed: Apr. 24, 1985

[30] Foreign Application Priority Data

Apr. 24, 1984 [JP] Japan .................................. 59-82447

[51] Int. Cl.$^4$ ............................................. H04H 5/00
[52] U.S. Cl. ........................................ 381/13; 455/63; 455/223
[58] Field of Search ........................... 381/4, 7, 13, 94; 455/63, 222, 223

[56] References Cited

U.S. PATENT DOCUMENTS 4,314,377  2/1982  Kondo et al. ......................... 381/13
4,574,390  3/1986  Hirohashi et al. ..................... 381/13

Primary Examiner—Forester W. Isen
Attorney, Agent, or Firm—Sughrue, Mion, Zinn, Macpeak and Seas

[57] ABSTRACT

A noise eliminating circuit including a subsignal modulator circuit, a matrix circuit, and sample-and-hold circuits, for reducing signal distortion as well as preventing the in-circuit generation of noise. The sample-and-hold circuits are disposed in the signal paths of a main signal and the demodulated subsignal and are operated by a signal synchronous with a noise component. The holding times of the two sample-and-hold circuits may be made different from one another.

6 Claims, 8 Drawing Figures (a) STEREO MODE (b) SAP MODE (c) NOISE MODE

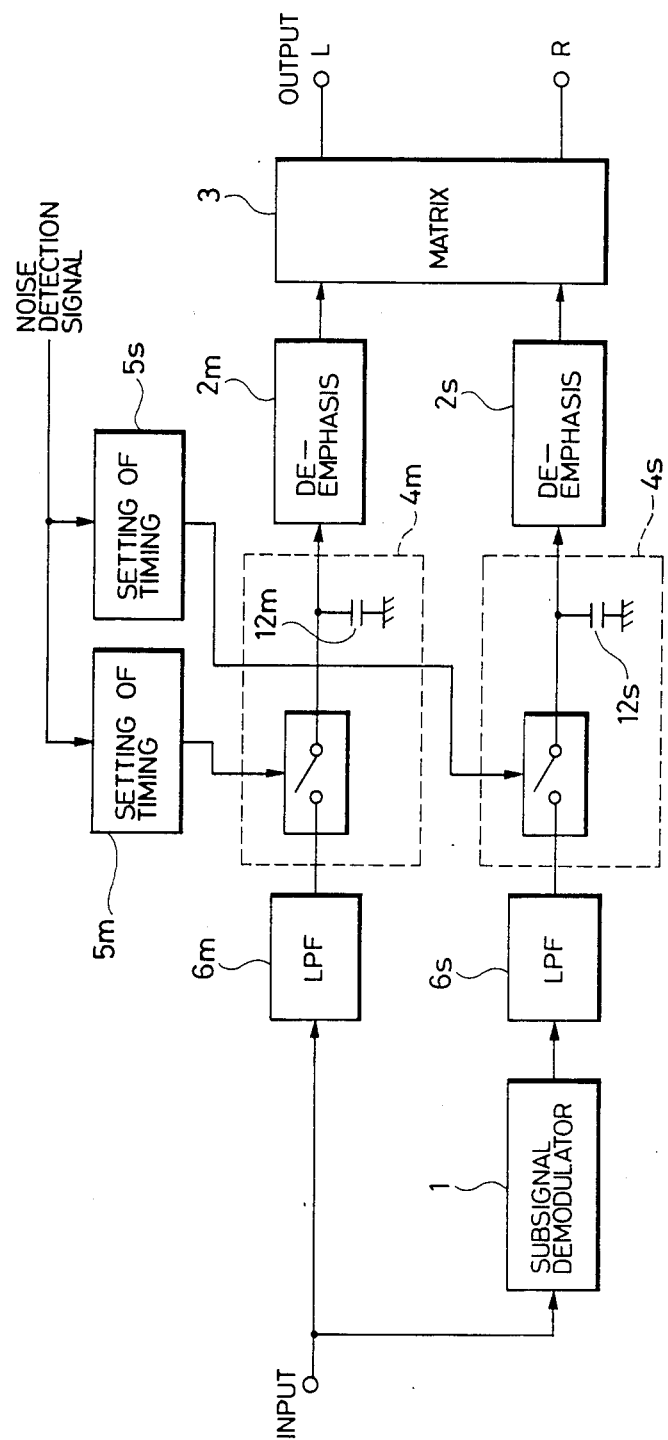

NOISE ELIMINATING CIRCUIT

BACKGROUND OF THE INVENTION

The present invention relates to a noise eliminating circuit, and more particularly to a noise eliminating circuit adapted for reducing noise contained in a composite signal generated by modulating a main signal with a subsignal.

A conventional noise eliminating circuit of the same general type to which the invention pertains is shown in FIGS. 1, 2 and 3.

More specifically, FIG. 1 shows a conventional TV audio multi-demodulator circuit. In FIG. 1 reference numeral 1 indicates a subsignal demodulator circuit; 2m and 2s, de-emphasis circuits; and 3, a matrix circuit.

FIG. 2 shows an FM stereo multiplex circuit and a conventional noise eliminator circuit, wherein 2L and 2R are de-emphasis circuits; 4, 4L and 4R are sample-and-hold circuits; 5 is a timing circuit; 6, 6L and 6R are low-pass filters; 7 is a 38-KHz bandpass filter; 8 is a phase comparator; 9 is a 38-KHz VCO; and 10 is a divide-by-two frequency divider. Although the sample-and-hold circuit 4 and the sample-and-hold circuits 4L and 4R among the above circuit components are provided in two different stages in the overall multiplex circuit, namely, in prior and subsequent stages, these circuits may be provided together in only one of the above two stages if desired.

For the conventional circuit configuration, in the TV audio multi-demodulator circuit of FIG. 1, a main signal is obtained by passing a composite signal through the de-emphasis circuit 2m serving as a subsignal-filter, and a subsignal is obtained by passing the same composite signal through the de-emphasis circuit 2s after demodulating it with the subsignal demodulator circuit 1. The main signal and the subsignal are applied to the matrix circuit 3. Thus, a bilingual audio signal and a stereo audio signal are obtained.

FIG. 2 shows an FM stereo multiplex circuit and a conventional noise eleminator circuit in which stereo demodulation is performed by the circuit enclosed by dotted lines. The elimination of noise is performed either by the sample-and-hold circuit 4 provided in the stage prior to the stereo demodulator stage, or by the sample-and-hold circuits 4L and 4R provided in the stage subsequent to the same. The low-pass filters (LPF) 6L and 6R provided in the prior stage to the sample-and-hold circuits 4L and 4R are used to suppress subcarrier leakage so as to minimize error in the held signal.

In the circuit shown in FIG. 2, although noise may be eliminated in the main signal, the sample-and-hold circuit 4 provided in the stage previous to the stereo demodulator stage may itself produce a large noise component in the subsignal in some cases because the subsignal carrier may be eliminated together with the actual noise. Moreover, if the sample-and-hold circuits 4L and 4R are provided in the stage previous to the stereo demodulator stage, the subsignal can be influenced by noise more easily than the main signal due to the presence of the bandpass filter or a demodulator circuit. Consequently, a long hold time must be provided for the subsignal in order for it to settle to a steady-state level at the output side of the matrix circuit, causing a large amount of signal distortion to occur. In addition, since the matrix circuit 3 generally contains an active circuit, the matrix circuit can be driven into saturation if a strong noise signal is present. This saturation sometimes causes the operating point of the circuit to vary, which gives rise to an additional source of noise.

FIG. 3 shows another conventional TV audio multi-demodulator. In FIG. 3, 14 is a low-pass filter having a cut-off frequency of 50 KHz, 15 is a bandpass filter for a frequency $5f_H$ (78.7 KHz) which is five times the pilot signal frequency $f_H$, 16 is a low-pass filter having a cut-off frequency of 15 KHz, 17 is a de-emphasis circuit, 18 is a PLL (Phase-Locked Loop) circuit which produces a carrier at a frequency of $2f_H$ from the pilot signal $f_H$, 19 is a pilot signal level detector circuit, 20 is a synchronous detector circuit which demodulates the (L-R) signal using as a reference the $2f_H$ signal from the PLL circuit 18, 21 is an FM detector circuit which demodulates the SAP (Separate Audio Program) signal, 22 is an SAP signal level detector circuit, 23 is a changeover switch the position of which is determined by the output of a logic circuit 26 described below, 24 is a noise reduction circuit which consists of a dbx (Trademark) circuit and a variable de-emphasis circuit, 25 is a matrix circuit, and 26 is a logic circuit used to determine the audio multiplex mode. The synchronous detector circuit 20 and the SAP signal FM detector circuit 21 correspond to the subsignal demodulator circuit 1 shown in FIG. 1.

In operation, $f_H$ and $2f_H$ carries in synchronization with the pilot signal are generated by the PLL circuit 18. The pilot signal level detector circuit 19 senses the presence of the pilot signal by detecting the $f_H$ signal. When the pilot signal is detected in this manner, it outputs a stereo broadcast discrimination signal to the logic circuit 26. The synchronous detector circuit 20 effects the synchronous detection of the (L-R) signal using the $2f_H$ signal as a reference.

On the other hand, the SAP signal separated from the main signal or from the (L-R) signal by the BPF 15 is detected by the FM detector circuit 21, and it is AM-detected simultaneously by the level detector circuit 22 and output as an SAP broadcast discrimination signal to the logic circuit 26. The logic circuit 26 sets an appropriate mode in response to the stereo broadcast discrimination signal, the SAP broadcast discrimination signal, or an externally supplied mode setting signal, and controls the changeover switch 23 and the matrix circuit 25 according to the mode so set.

After being decoded by the noise reduction circuit 24, the (L-R) signal or the SAP signal (as selected by the changeover switch 23) is input to the matrix circuit 25, to which the main signal is also input through the LPF 16 and the de-emphasis circuit 17. In this manner, a stereo signal or the like is obtained.

In the above TV audio multi-demodulator circuit, when noise is present in the input signal or when the input signal is temporarily interrupted, the FM detector circuit 21 used for demodulating the SAP signal or some other circuit may malfunction and produce noise. In such a case, the noise reduction circuit 24 and the matrix circuit 25 can be saturated and their DC operating points caused to shift, resulting in the further occurrence of strong noise. Noise contained in the input signal can also cause the noise reduction circuit 24 to produce errors in level detection. In this case, an inharmonious audio signal is output because the input signal is not decoded properly.

SUMMARY OF THE INVENTION

Accordingly, it is an object of the present invention to provide a noise eliminating circuit in which the above-mentioned disadvantages and drawbacks have been eliminated.

In accordance with the above and other objects, the invention provides a noise eliminating circuit comprising a subsignal demodulator circuit for demodulating a subsignal from a composite multiplexed signal containing a main signal and a subsignal, a matrix circuit for effecting arithmetic operations upon the main signal and the demodulated subsignal from the subsignal demodulator circuit so as to produce first and second output signals, and a sample-and-hold circuit interposed between the subsignal demodulator circuit and the matrix circuit in the signal paths of the subsignal for sampling and holding the demodulated subsignal in response to a signal synchronized with at least one of a noise detection signal and a noise component contained in the subsignal.

BRIEF DESCRIPTION OF THE DRAWINGS

In the accompanying drawings:

FIGS. 4 through 8 are block diagrams of respective embodiments of noise eliminating circuits of the invention.

DESCRIPTION OF THE PREFERRED EMBODIMENTS

Figure 3:
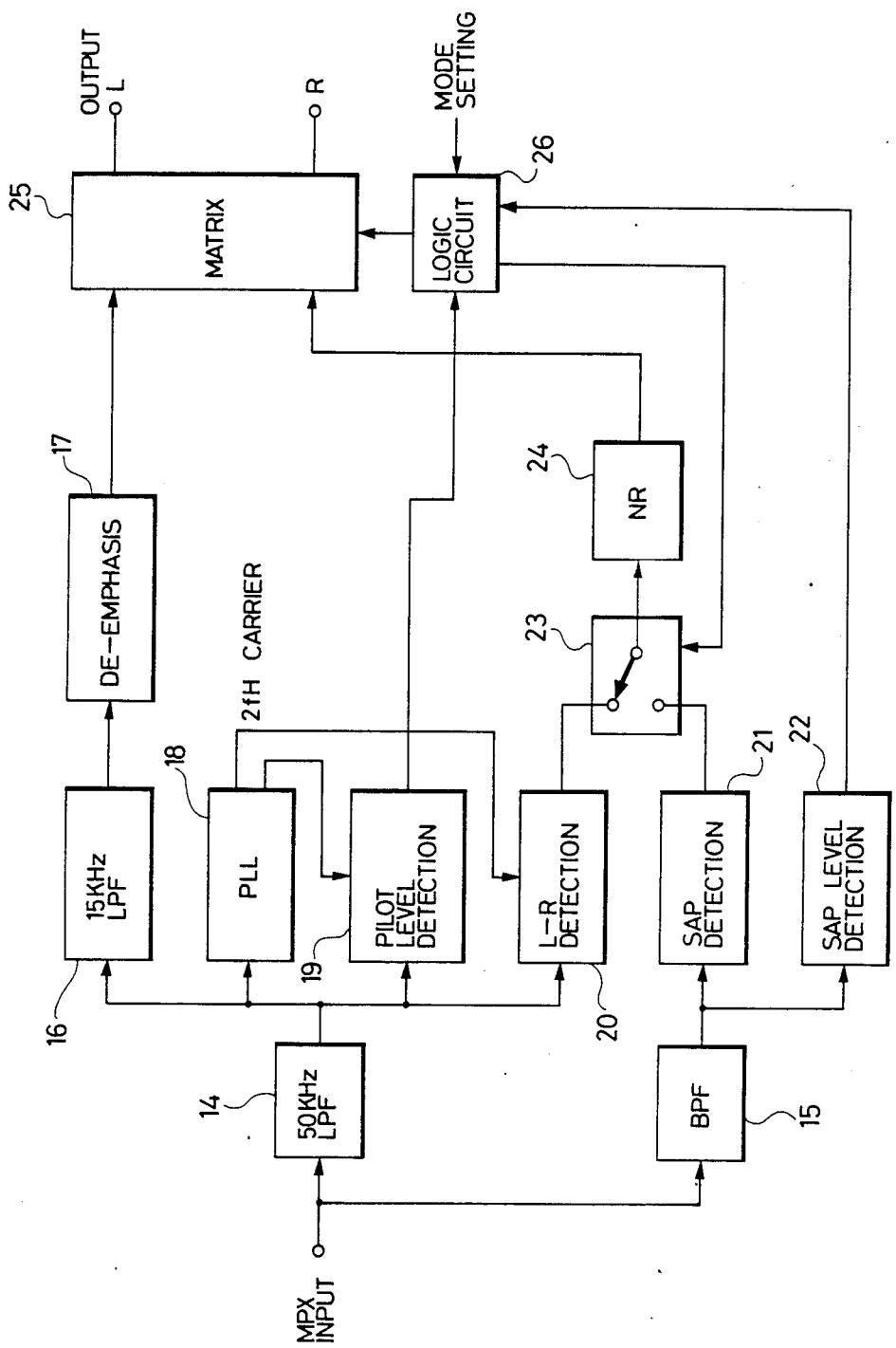
Figure 4:
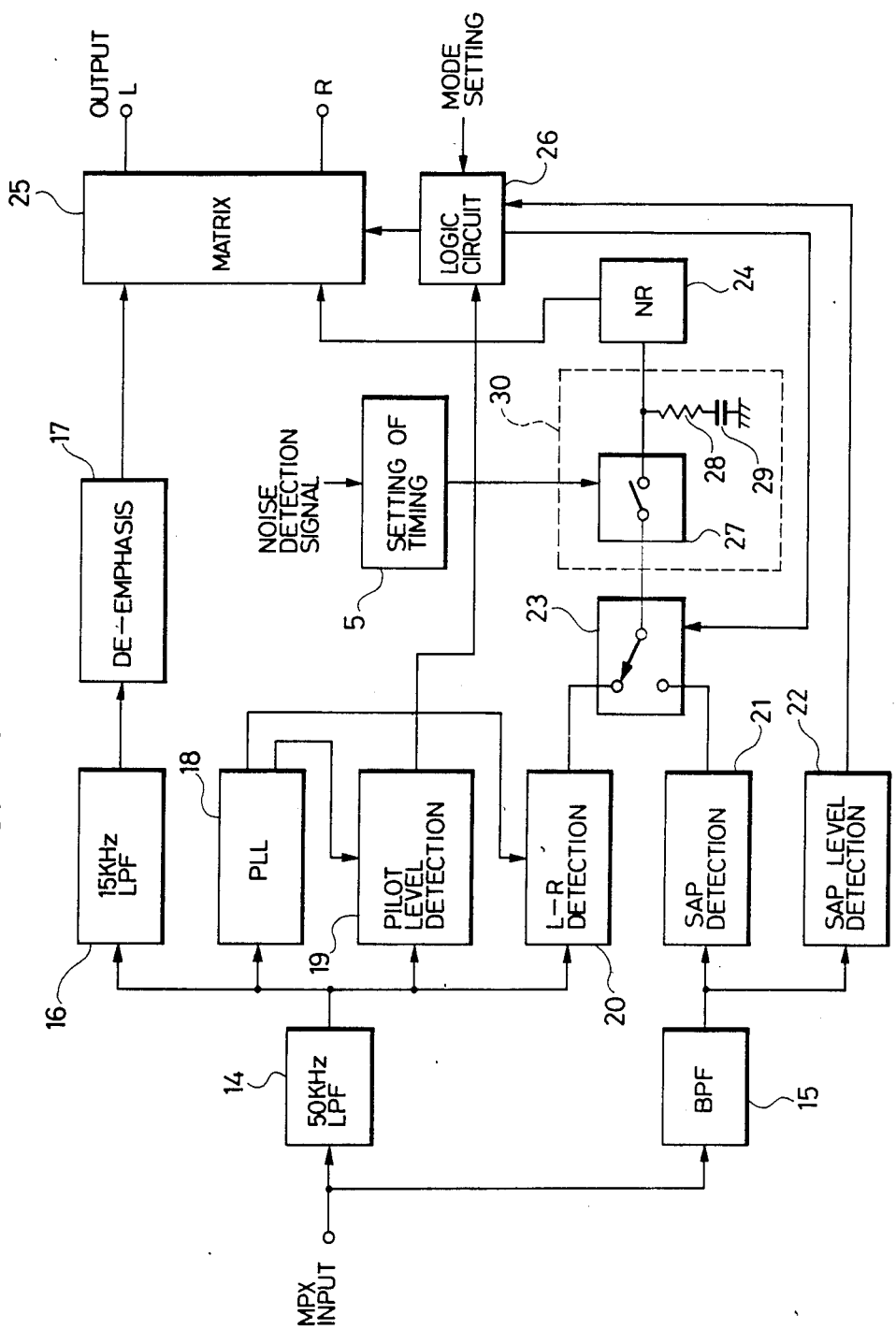

FIG. 4 shows an improved circuit configuration wherein the noise reduction circuit 24 and the matrix circuit 25 produce no noise and the noise reduction circuit 24 provides proper decoding. In FIG. 4, reference numbers and characters used commonly in FIG. 3 denote like components. This this circuit, 5 is a timing circuit which opens the gate 27 (described below) in the presence of noise, for instance, caused by signals synchronized with a noise detection signal or the like. This circuit operates in essentially the same manner as that of FIG. 3. Further, reference numeral 30 denotes a sample-and-hold circuit composed of a gate 27, a resistor 28, and a capacitor 29. In the TV audio multi-demodulator circuit of FIG. 4, the gate 27 is opened by the timing circuit 5 if noise is detected. The voltage present immediately before the gate 27 is opened is held by the capacitor 29 throughout the time the gate 27 is open, whereby the noise is eliminated.

Figure 5:
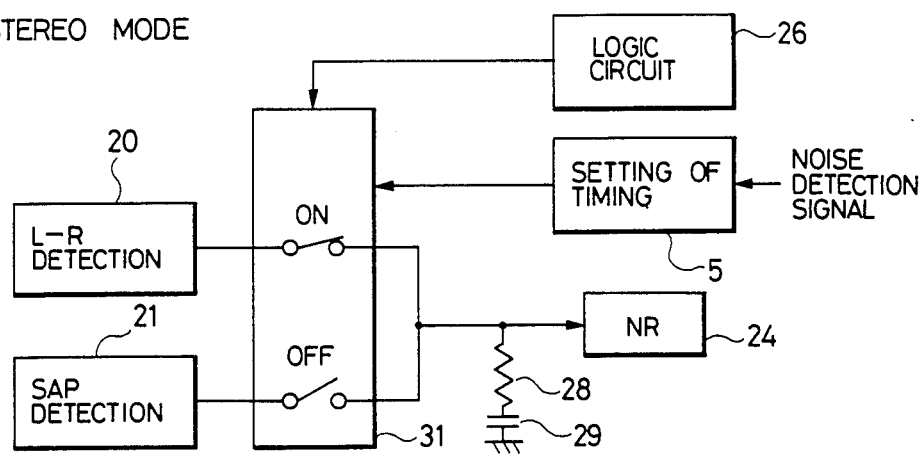
Figure 5:
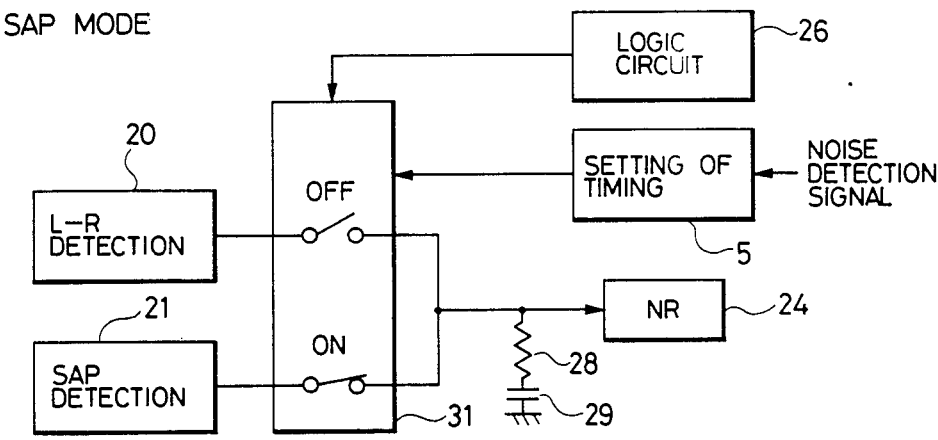
Figure 5:
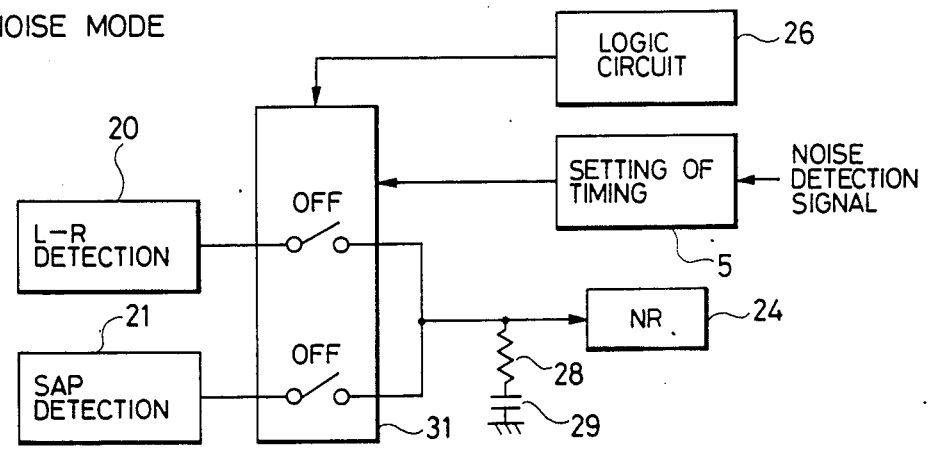

Although the sample-and-hold circuit 30 is provided in the stage following the changeover switch 23 in the above embodiment, it may be connected between the changeover switch 23 and the synchronous detector circuit 20, or between the changeover switch 23 and the FM detector circuit 21. Further, it is more effective if a second sample-and-hold circuit is provided between the LPF 16 and the de-emphasis circuit 17 to eliminate noise contained in a main signal. Moreover, as shown in FIG. 5, it is also recommendable to provide a switching device 31, composed of two gates and controlled by the logic circuit 26 and the timing set circuit 5. The two gates of the switching device 31 are opened when noise is present.

Figure 6:
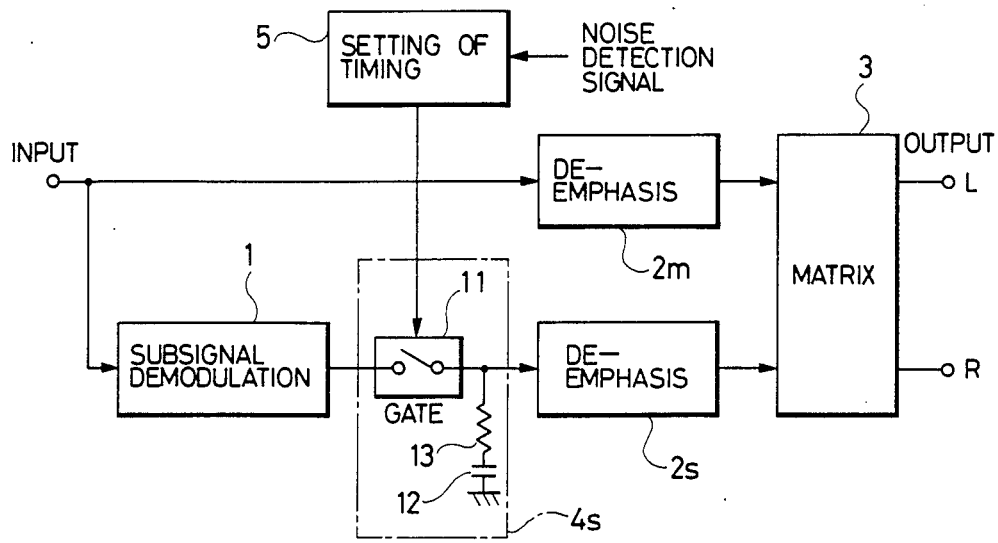

FIG. 6 is a block diagram of a preferred embodiment of a noise eliminating circuit constructed in accordance with the present invention. In the FIG. 6, 1 is a subsignal demodulator circuit, 2m and 2s are deemphasis circuits, 3 is a matrix circuit, 4s is a sample-and-hold circuit, 5 is a timing circuit, 11 is a gate circuit, 12 is a holding capacitor, and 13 is a resistor which together with the capacitor 12 forms a time constant circuit used to reduce error in the held signal due to a leaked subsignal carrier or the like.

In this circuit, a main signal passing through the de-emphasis circuit 2m, which also serves as a filter to suppress the subsignal, is input to the matrix circuit 3. On the other hand, the subsignal, after being demodulated by the subsignal demodulator circuit 1, is applied to the matrix circuit 3 through the sample-and-hold circuit 4s and the de-emphasis circuit 2s. The timing circuit 5 generates a signal to open the gate 11 during the time the subsignal is influenced by noise such as may be caused by a signal synchronized with the noise detection signal, a cyclical noise source, or some other source. The noise is eliminated as follows: The voltage present immediately before the gate 11 is opened is sampled while the gate 11 remains open and then held by the capacitor 11 when the gate 12 is closed. The capacitance of the resistor 13 together with that of the capcitor 12 determines a time constant for reducing error in the held signal. However, this is not required if there is no leakage of the subsignal. The de-emphasis circuits 2m and 2s may also be located in the stage subsequent to the matrix circuit 3.

Figure 1:
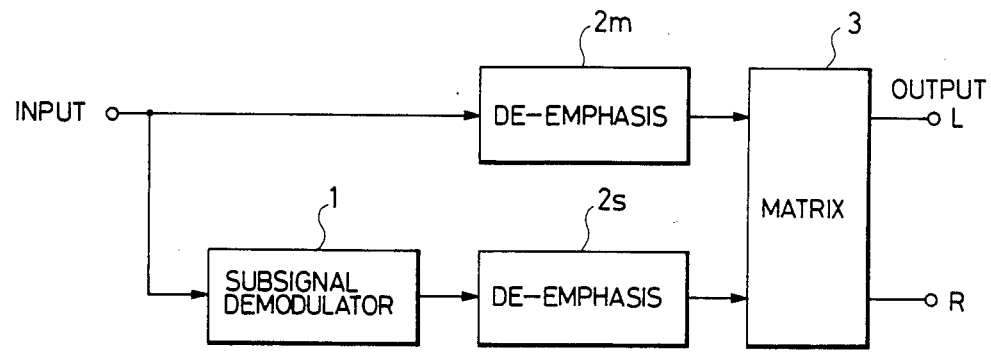
FIGS. 1 through 3 are block diagrams of various conventional noise eliminating circuits.
Figure 2:
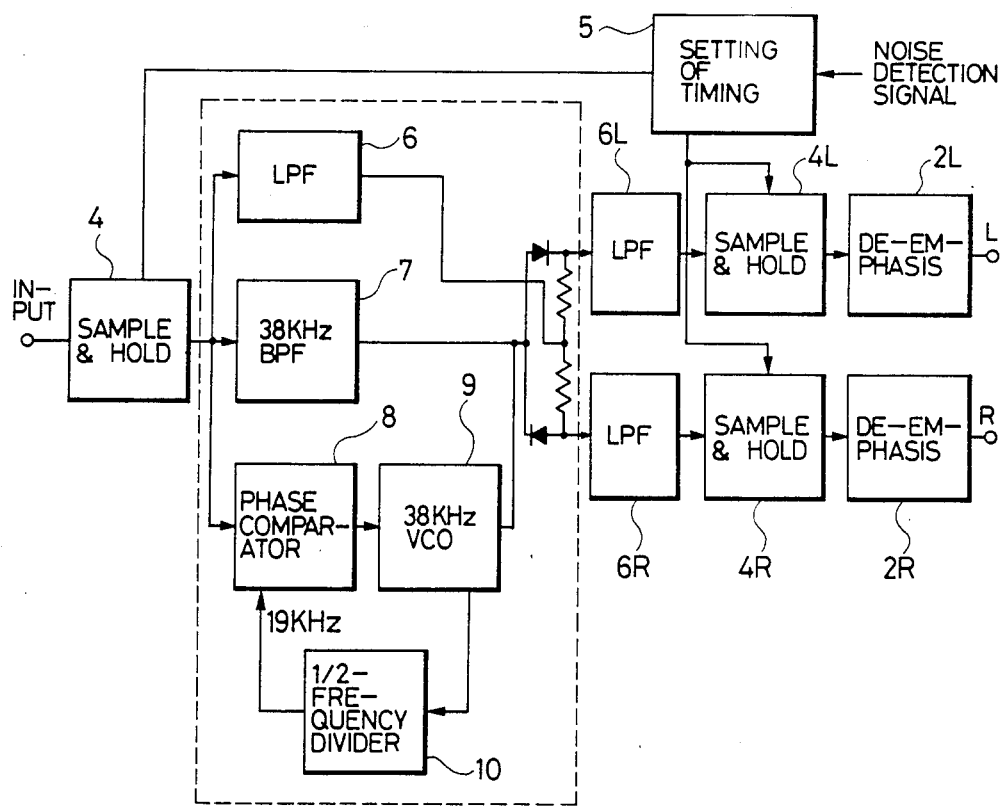

Although this embodiment has been described with reference to an aplication to a TV audio multidemodulator circuit, the noise eliminator in accordance with the present invention may also be applied to an FM tuner or the like using a circuit configuration similar to that shown in FIG. 2.

Figure 7:
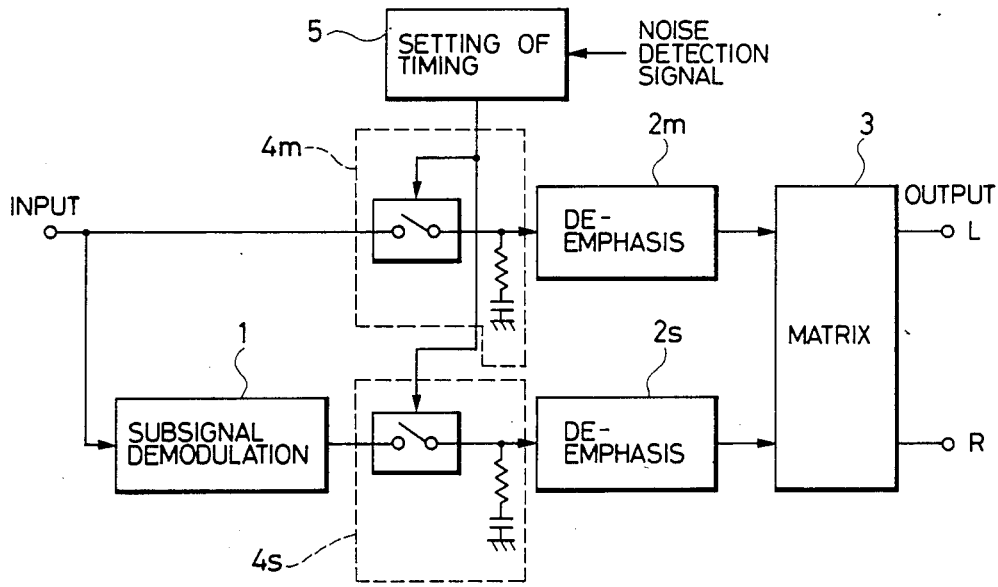

In the FIG. 6 embodiment, noise only in the subsignal is eliminated. However, noise may be eliminated in the main signal as well by providing a sample-and-hold circuit 4m for the main signal as shown in FIG. 7. Although distortion may occur in this case to the same extent as in the conventional circuit, the subsignal demodulator circuit 1 will not produce noise and the matrix circuit 3 will not be saturated by noise.

When eliminating noise by the use of the sample-and-hold circuit as shown in FIG. 7, the hold time must be set to a minimum, within certain limitations, since the amount of distortion is increased if the hold time is made too long. On the other hand, the subsignal tends to be more strongly affected by noise than the main signal because it passes through the BPF and the subsignal demodulator circuit. Therefore, noise elimination in the subsignal will be insufficient if the hold time is too short. On the other hand, the amount of distortion of the main signal is increased if the hold time is too long.

In the embodiment shown in the FIG. 8, these drawbacks are ameliorated. Since the hold time for the main signal, compared with that for the subsignal, may be short, it is possible to reduce the amount of distortion by setting the hold time for the main signal to the minimum by employing the circuit configuration shown in the FIG. 8. In this circuit, the sample-and-hold circuit 4m of the main signal system and the sample-and-hold circuit 4s of the subsignal system are provided respectively with timing circuits 5m and 5s generating different sampling pulse signals. In this case, the hold time of the sample-and-hold circuit 4m of the main signal system should be set by the timing circuit 5m to be shorter than the hold time of the sample-and-hold circuit 4s of the subsignal system set by the timing circuit 5s.

In this circuit, although stereo separation is reduced during periods when the hold time for the subsignal is made longer, this is preferable to the presence of noise since the human ear is more tolerant to a reduction of stereo separation than to noise and distortion.

In FIG. 8, the low-pass filters 6m and 6s, employed as substitutes for the resistors connected in series with the hold capacitors in the FIG. 7 embodiment, are provided in the stages previous to the sample-and-hold circuits 4m and 4s, respectively, for the purpose of reducing the holding error. In this case, the holding error may be made yet smaller if low-pass filters having sharp cut-off characteristics are used as the low-pass filters 6m and 6s and resistors are inserted in series with the hold capacitors 12m and 12s.

The de-emphasis circuits 2m and 2s may be located in the stage following the matrix circuit 3. However, locating the de-emphasis circuits 2m and 2s between the sample-and-hold circuits 4m and 4s and the matrix circuit 3 aids in the prevention of matrix circuit saturation by lowering the level of signals inputted to the matrix circuit and reducing the amount of distortion due to the operation of the sample-and-hold circuit.

Delay lines may be inserted in the main signal paths to compensate for the delay of the subsignal by the subsignal demodulator circuit. In this case, delay lines may be inserted in any desired position by appropriately shifting the timing of the opening of the gate of the sample-and-hold circuit.

For the reasons described above, the noise eliminating circuit in accordance with the present invention is provided between a subsignal demodulator circuit and a matrix circuit and employs a sample-and-hold circuit for noise elimination. With this circuit, loss of the subsignal carrier and the like are prevented and no new noise source is introduced in the subsignal demodulator circuit and the matrix circuit since noise is eliminated at the stage previous to the matrix circuit. Because the subsignal is much more strongly affected by noise, it is preferred that noise eliminating circuitry be provided only for that signal and not the main signal because only half the number of circuit components is required.

If diversity reception is employed wherein signals from multiple antennas are periodically sampled, noise may sometimes be present for a comparatively long time, in which case the noise content of the subsignal is much greater than that of the main signal. In the conventional circuit, if the holding time for the main signal is made long to compensate, the overall signal quality is strongly deteriorated in some cases. It is also noted that a large amount of noise can be generated in that case by the subsignal demodulator circuit because the subsignal is eliminated for a relatively long period. However, these disadvantages are not present in the noise eliminating circuit of the present invention, and therefore a receiver using the noise eliminating circuit of the invention is more effective for receiving signals in a diversity receiving mode.

We claim:

1. A noise eliminating circuit for use in a TV audio multi-demodulator circuit, said noise eliminating circuit comprising:
    a subsignal demodulator circuit for demodulating a subsignal from a composite multiplexed signal containing a main signal and a subsignal,
    a matrix circuit for effecting arithmetic operations upon said main signal and the demodulated subsignal from said subsignal demodulator circuit to produce first and second output signals, and
    sample-and-hold circuit means interposed between said subsignal demodulator circuit and said matrix circuit in a signal path of said subsignal for sampling and holding said demodulated subsignal in response to a signal synchronized with at least one of a noise detection signal and a noise component contained in said subsignal,
    noise elimination being performed only on said demodulated subsignal in said TV audio multi-demodulator circuit, said main signal being passed to said matrix circuit without having noise elimination performed thereon.

2. The noise eliminating circuit as claimed in claim 1, further comprising first and second de-emphasis circuits disposed in signal paths of said main signal and said subsignal, respectively.

3. A noise eliminating circuit comprising:
    a subsignal demodulator circuit for demodulating a subsignal from a composite multiplexed signal containing a main signal and a subsignal,
    a matrix circuit for effecting arithmetic operations upon said main signal and the demodulated subsignal from said subsignal demodulation circuit to produce first and second output signals, and
    first and second sample-and-hold circuit means interposed, respectively, in a signal path of said main signal prior to said matrix circuit and in a signal path of said subsignal between said subsignal demodulator circuit and said matrix circuit for sampling and holding said main signal and said subsignal in response to a signal synchronized with at least one of a noise detection signal and a noise component contained in one of said main signal and said subsignal, a hold time of said second sample-and-hold circuit being longer than a hold time of said first sample-and-hold circuit.

4. The noise eliminating circuit as claimed in claim 3, further comprising first and second de-emphasis circuits disposed in signal paths of said main signal and said subsignal, respectively.

5. The noise eliminating circuit as claimed in claim 3, further comprising first and second low-pass filters disposed in signal paths of said main signal and said subsignal, respectively, prior to said first and second sample-and-hold circuits.

6. The noise eliminating circuit as claimed in claim 5, wherein said first and second sample-and-hold circuits comprise capacitive holding elements with substantially no series resistance.

* * * * *